United States Patent [19]
Lee

[11] Patent Number: 6,077,450
[45] Date of Patent: Jun. 20, 2000

[54] METHOD FOR ETCHING PLATINUM

[75] Inventor: Jun Sik Lee, Chungcheongbuk-do, Rep. of Korea

[73] Assignee: LG Semicon Co., Ltd., Chungcheongbuk-do, Rep. of Korea

[21] Appl. No.: 09/060,297

[22] Filed: Apr. 15, 1998

[30] Foreign Application Priority Data

Nov. 14, 1997 [HR] Croatia ................................. 97/60062

[51] Int. Cl.⁷ ............................. B44C 1/22; H01L 21/302
[52] U.S. Cl. ................................ 216/72; 216/47; 216/51; 216/75; 438/738
[58] Field of Search ............................. 216/47, 62, 72, 216/51, 75; 438/738

[56] References Cited

U.S. PATENT DOCUMENTS

| | | | |
|---|---|---|---|
| 5,515,984 | 5/1996 | Yokoyama et al. | 216/75 |
| 5,599,424 | 2/1997 | Matsumoto et al. | 216/75 |
| 5,840,200 | 11/1998 | Nakagawa et al. | 216/6 |
| 5,854,104 | 12/1998 | Onishi et al. | 438/240 |

*Primary Examiner*—Randy Gulakowski
*Assistant Examiner*—Shamim Ahmed

[57] ABSTRACT

A method for etching platinum in which used are an etch gas and a mask having a good etch ratio with platinum when a lower electrode is made of platinum is disclosed, including the steps of depositing a platinum layer on an insulator; depositing on the platinum layer a mask layer having a high selectivity with the platinum layer; patterning the mask layer to be spaced apart by a predetermined distance; and implanting an etch gas making an etch ratio of the platinum layer and the mask layer more than 2 to etch the platinum layer by using the mask layer.

13 Claims, 6 Drawing Sheets

METHOD FOR ETCHING PLATINUM

BACKGROUND OF THE INVENTION

1. Field of the Invention

The present invention relates to a method for etching a lower electrode of a high dielectric film and, more particularly, to a method for etching platinum in which used are an etch gas and a mask having a good etch ratio with platinum when a lower electrode is made of platinum.

2. Discussion of the Related Art

A background method for etching platinum will be described with reference to the accompanying drawings.

Referring to FIG. 1A, a 100 Angstrom thick titanium (Ti) layer and a 100 Angstrom thick titanium nitride (TiN) layer are successively deposited on a silicon insulating film 1 to form a glue layer 2. A 1000~1500 Angstrom thick platinum (Pt) layer 3 used as a lower electrode in a capacitor is deposited on the titanium nitride layer.

Referring to FIG. 1B, a 4000~5000 Angstrom thick silicon oxide film 4 is formed on the Pt layer 3, used as a hard mask. A photoresist film 5 is coated on the silicon oxide film 4 and patterned with an exposure and development process.

Referring to FIG. 1C, the silicon oxide film 4 is anisotropically etched with the patterned photoresist film 5 serving as a mask.

Referring to FIG. 1D, the Pt layer 3 and the glue layer 2 are etched with the patterned silicon oxide film 4 serving as a mask by appropriately mixing $Cl_2/Ar/O_2$ under a low pressure in an MERIE (magnetron enhanced reactive ion etcher) type equipment.

At this time, the maximum etch ratio of the platinum layer 3 and the silicon oxide film 4 is 1.2:1.

The silicon oxide film 4 used as a hard mask is wet-etched by being dipped into HF liquid solution. After etching the silicon oxide film 4, reaction product 6 generated remains on the side of the platinum layer 3 and the glue layer 2. Platinum is 70% of this reaction product 6, and the rest 30% is H, C, and O. This reaction product 6 having a form of a rabbit ear is removed with HCl solution.

However, the background method for etching platinum has the following problems. Since the maximum etch ration of a platinum layer and a silicon oxide film is 1.2:1, the more highly integrated the device is, the thicker the silicon oxide film is. Because there is a limit in increasing the thickness of a photoresist film, patterns of a silicon oxide film may become poor. Due to poor patterns used as hard masks, etch reliability of platinum becomes inferior. Further, since adhesion of a platinum layer and a silicon oxide film used as a hard mask is poor, peeling is generated in patterning a photoresist film and it is thus hard to form a stable platinum layer. Furthermore, since a reaction product formed by reaction of the platinum and the silicon oxide film is of the form of a rabbit ear, it is hard stably to proceed following process steps. This reaction product having the form of a rabbit ear may cause leakage current in capacitors.

SUMMARY OF THE INVENTION

Therefore, the present invention is directed to a method for etching platinum that substantially obviates one or more of problems due to limitations and disadvantages of the related art.

An object of the invention is to provide a method for etching platinum in which used are an etch gas and a mask having a high etch ratio with platinum.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for etching platinum includes the steps of depositing a platinum layer on an insulator; depositing on the platinum layer a mask layer having a high selectivity with the platinum layer; patterning the mask layer to be spaced apart by a predetermined distance; and implanting an etch gas making an etch ratio of the platinum layer and the mask layer more than 2 to etch the platinum layer.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

According to the present invention, a mask having a high selectivity with platinum should be selected and a corresponding etch gas is used so that platinum is etched. Different many materials as a mask and etch gases are experimented used to select an optimal material for mask and a gas.

Figure 1A:
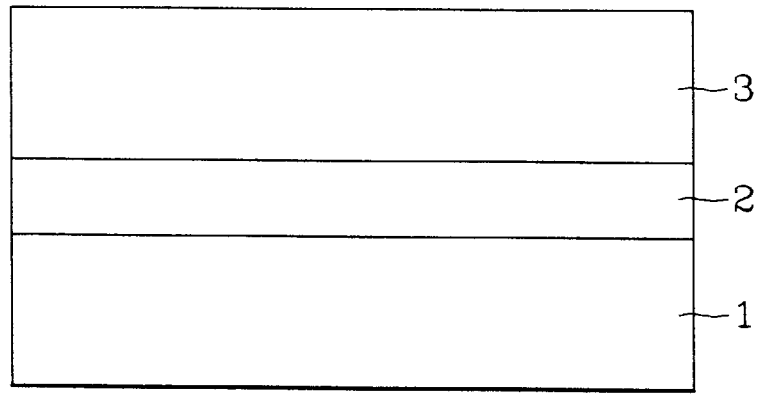
FIGS. 1A to 1D are cross-sectional views showing process steps of a background method for etching platinum.
Figure 1B:
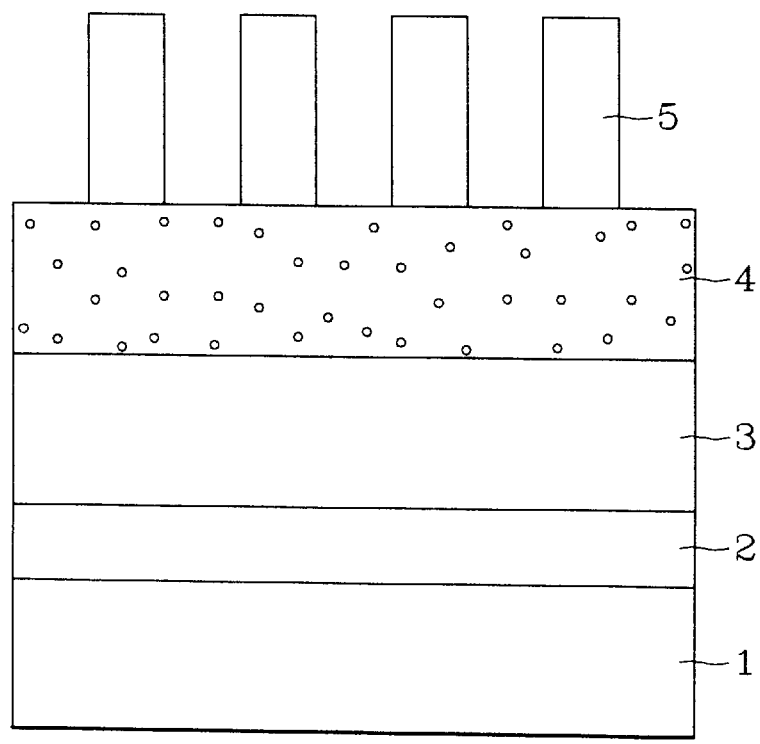
Figure 1C:
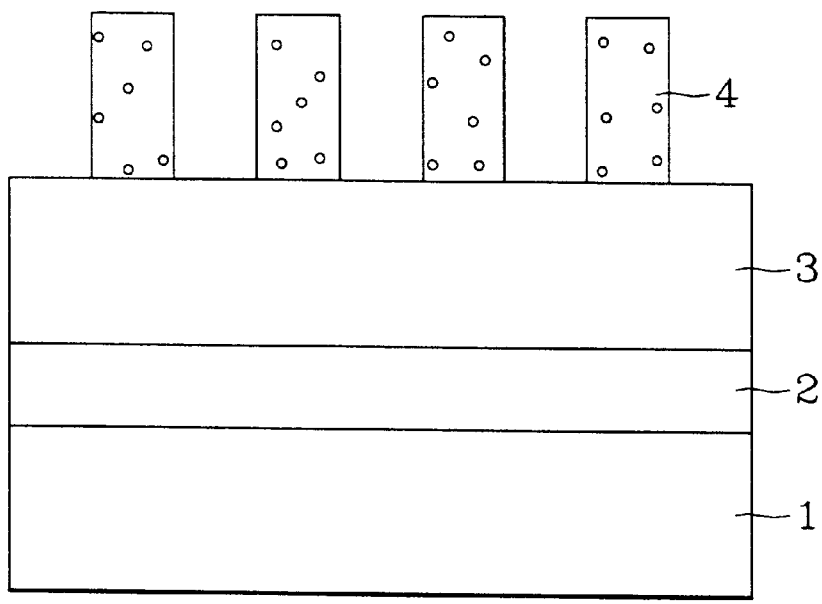
Figure 1D:
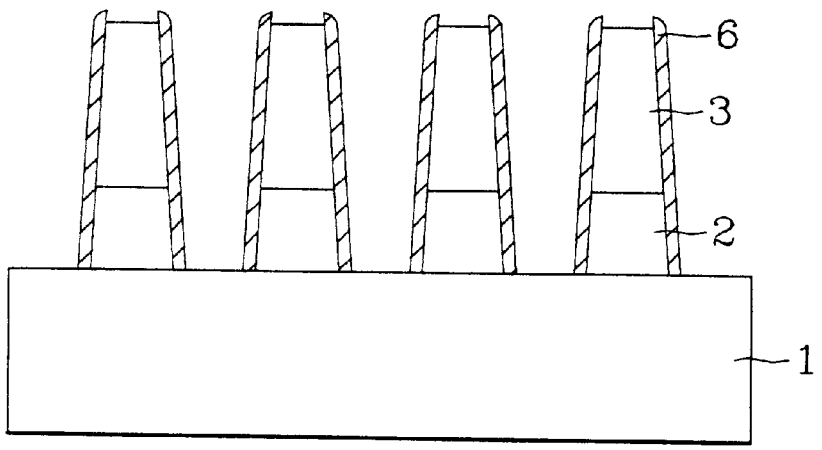
Figure 2:
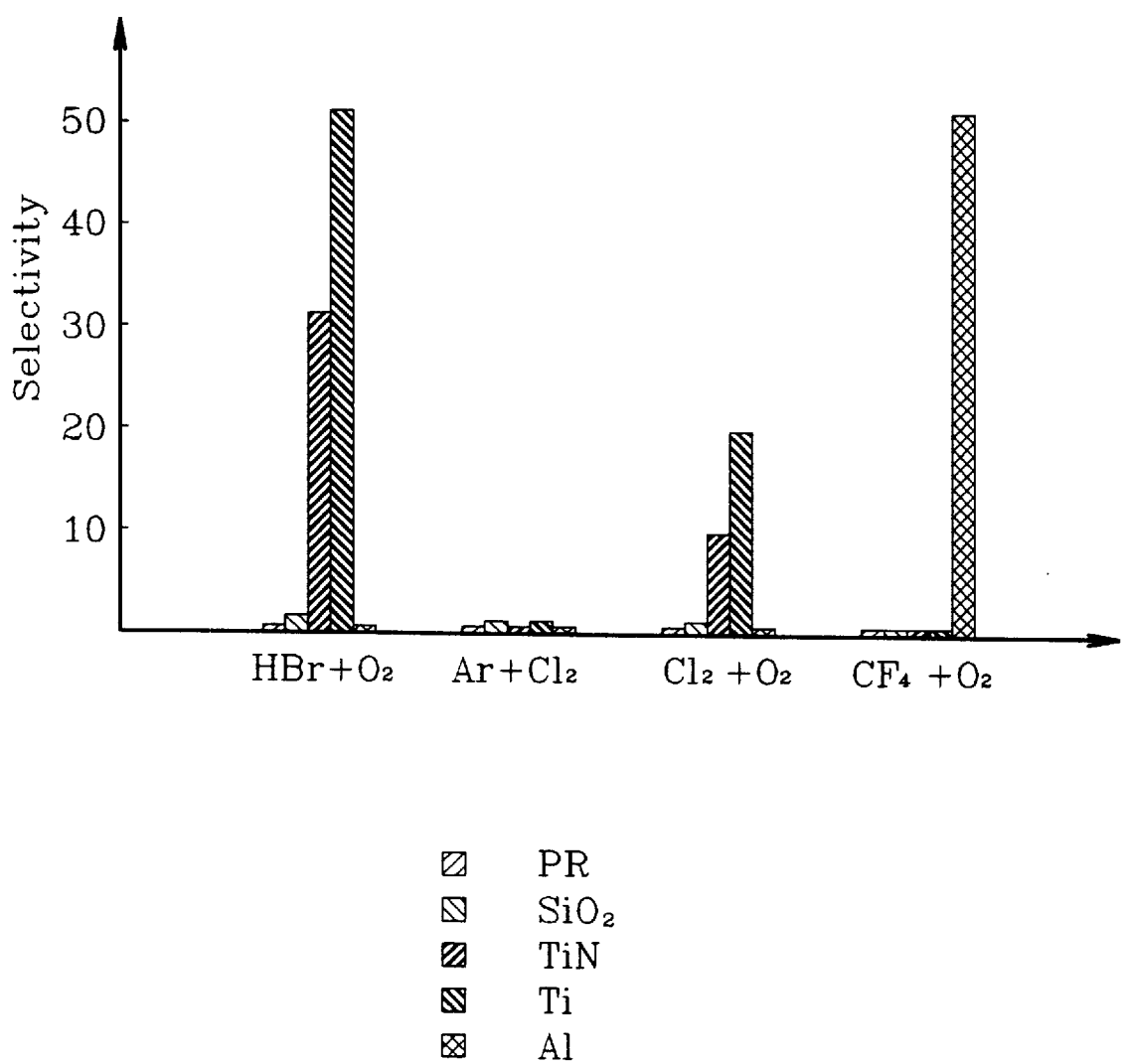
FIG. 2 shows experiment data of the etch ratio of mask and platinum (Pt) by etch gas.

Referring to FIG. 2 that shows etch selectivities with platinum, photoresist, silicon oxide $SiO_2$ film, titanium nitride (TiN), titanium(Ti), and aluminum (Al) are experimented as a mask. As an etch gas, $HBr+O_2$, $Ar+Cl_2$, $Cl_2+O_2$, and $C_4F+_2O$ are experimented.

When $HBr+O_2$, $Ar+Cl_2$, $Cl_2+O_2$, or $CF_4+O_2$ is used as an etch gas, the etch ratio of a photoresist film PR, used as a mask, with platinum is less than 1:1.

When $HBr+O_2$ or $Cl_2+O_2$ is used as an etch gas, the etch ratio of a silicon oxide film, used as a mask, with platinum is 1.2:1. When each of the rest gases is used, the etch ratio of a silicon oxide film with platinum is less than 1:1.

When $HBr+O_2$ is used as an etch gas, the etch ratio of a TiN layer with platinum is 30:1. When $Cl_2+O_2$ is used, the etch ratio of a TiN layer with platinum is 10:1.

When $HBr+O_2$ is used, the etch ratio of a Ti layer with platinum is 50:1. When $Cl_2+O_2$ is used as an etch gas, the etch ratio of a Ti layer with platinum is 20:1.

When a gas containing fluorine such as $CF_4+O_2$ is used, the etch ratio of an aluminum (Al) layer with platinum is 50:1.

FIGS. 3A to 3E are cross-sectional views showing process steps of a method for etching platinum according to an embodiment of the present invention.

Figure 3A:
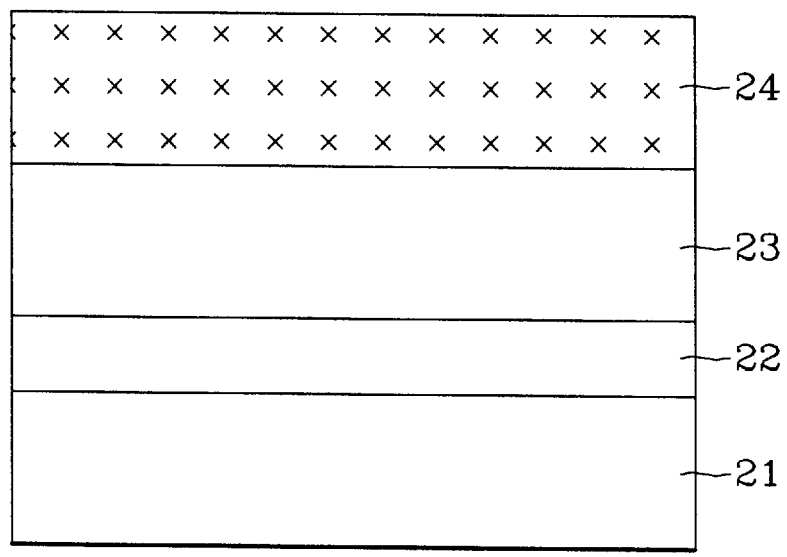
FIGS. 3A to 3E are cross-sectional views showing process steps of a method for etching platinum according to an embodiment of the present invention.

Referring initially to FIG. 3A, a 100 Angstrom thick titanium layer and a 100 Angstrom thick titanium nitride layer are successively deposited on a silicon insulating layer 21 so that formed is a glue layer 22 composed of the Ti layer and the TiN layer. A 2500~3000 Angstrom thick platinum layer 23 is sputtered on the titanium nitride layer. A 6000 Angstrom thick titanium nitride layer 24 is formed on the platinum layer 23. Instead of a titanium nitride layer 24, a titanium layer or an aluminum layer or an aluminum alloy layer such as, Al/AlSi, or AlSiCu may be deposited. A non-conductive layer such as a silicon oxide layer, a silicon nitride layer, or a photoresist film may be additionally deposited on the titanium nitride layer 24.

Figure 3B:
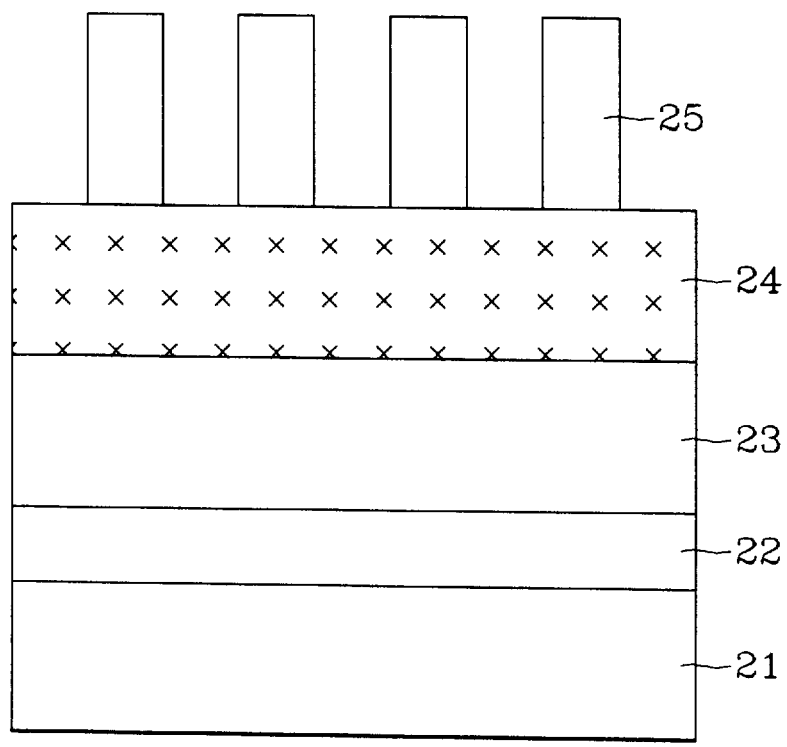

Referring to FIG. 3B, a 7500 Angstrom thick photoresist film 25 is coated on the titanium nitride layer 24 and patterned selectively by using a KrF stepper having 0.43 $\mu$m pitch (0.21 space).

Figure 3C:
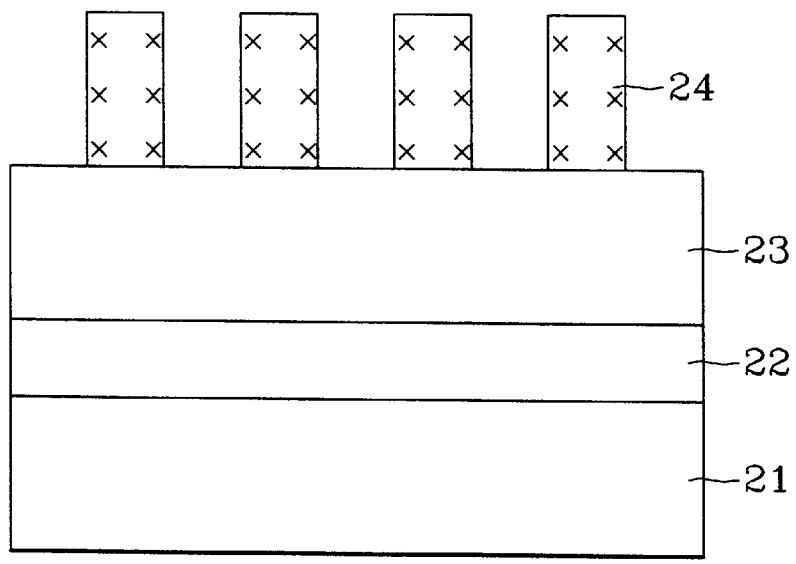

Referring to FIG. 3C, $Cl_2$+HBr is injected with the patterned photoresist film 25 serving as a mask to etch the titanium nitride layer 24. Then the remaining photoresist film is removed. In case that a non-conductive layer is deposited on the titanium nitride layer 24, the non-conductive layer is etched with the patterned photoresist film serving as a mask and the titanium nitride layer 24 is then etched with the etched nonconductive layer serving as a mask.

Figure 3D:
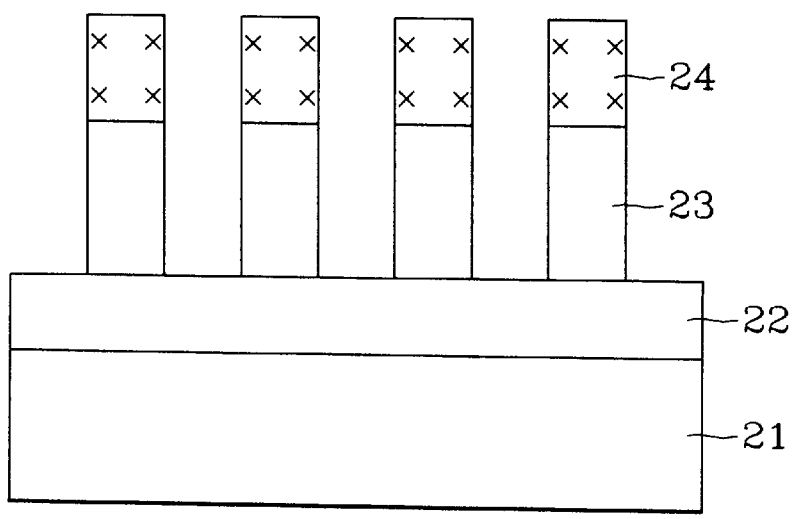

Referring to FIG. 3D, when the titanium nitride layer 24 serves as a mask, the platinum layer 23 is etched in 25 HBr+25 $O_2$ under a pressure of 5 mTorr for 200 seconds by imposing an energy of 300~600 w (13.56 MHz) on a high-frequency provider and an energy of 0~100 w (450 kHz) on a low-frequency provider.

Otherwise, when an aluminum alloy layer is used as a mask, a fluorine base gas such as $CF_x$, $C_yF_x$, $C_2F_6$, or $C_3F_8$ and $O_2$ is used as an etch gas. When 50 $CF_4$+50 $O_2$ is used, the platinum layer 23 is etched under a pressure of 5 mTorr for 300 seconds by imposing an energy of 300~600 w (13.56 MHz) on a high frequency provider and an energy of 0~100 w (450 KHz) on a low-frequency provider. When the platinum layer 23 is etched, a reaction product can be generated. If a mask is made of titanium group, the reaction product is removed with HBr+$O_2$ or $Cl_2$+$O_2$. If an aluminum alloy layer is used as a mask, a gas containing fluorine is used to remove the reaction product. In the composition of the reaction product, Pt is 70% and C, H, and O is 30%.

Figure 3E:
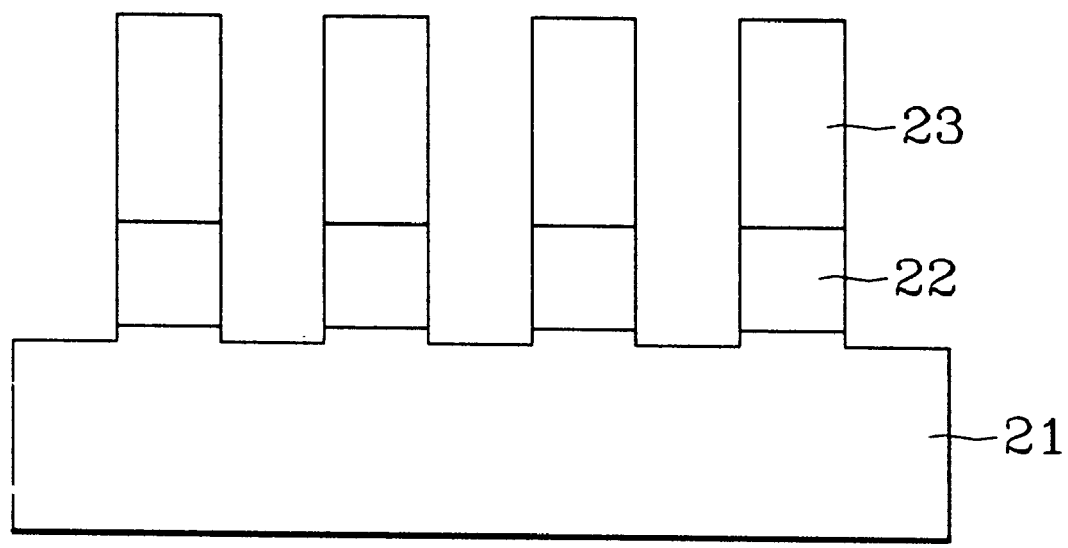

Referring to FIG. 3E, the titanium nitride layer and the glue layer 22 are etched.

The method for etching platinum has the following advantages. First, since a mask having a high etch ratio with platinum is used without increasing the thickness of a hard mask or a photoresist film, platinum can be stably etched. Further, since a mask having a good etch ratio with platinum is used, reaction product is prevented from being generated on the side of the platinum, thereby forming a good dielectric film. Furthermore, the problem of adhesion of the mask and the platinum can be avoided, photo process of platinum becomes facilitated and the process reliability becomes superior.

It will be apparent to those skilled in the art that various modification and variations can be made in the method for etching platinum of the present invention without departing from the spirit or scope of the inventions. Thus, it is intended that the present invention cover the modifications and variations of this invention provided they come within the scope of the appended claims and their equivalents.

What is claimed is:

1. A method for etching platinum comprising the steps of:
   depositing a platinum layer on an insulator;
   depositing on the platinum layer an aluminum alloy mask layer having a high selectivity with the platinum layer;
   patterning the aluminum alloy mask layer to be spaced apart by a predetermined distance; and
   etching the platinum layer using the aluminum alloy mask layer and an etch gas chosen from the group comprising $CF_x$, $C_yF_x$, $C_2F_4$ or $C_2F_8$ and $O_2$ such that an etch ratio of the platinum layer and the aluminum alloy mask layer of more than 2 results to etch the platinum layer by using the aluminum alloy mask layer.

2. The method as claimed in claim 1, wherein the etching step etches such that, an etch ratio between the platinum and aluminum alloy mask layer of 50:1 results.

3. The method as claimed in claim 1, wherein, in the etching step, etching is performed at a pressure in a range of 5~10 mTorr.

4. The method as claimed in claim 1, wherein, in the etching step, etching is performed at 300~600 w imposed on a high frequency (MHz) provider and 0~100 w on a low frequency (KHz) provider.

5. The method as claimed in claim 1, further comprising the step of:
   depositing a non-conductive layer on the aluminum alloy mask layer.

6. The method as claimed in claim 5, wherein the non-conductive layer is a silicon oxide film, a silicon nitride film, or a photoresist film.

7. A method for etching platinum comprising the steps of:
   depositing a glue layer on an insulator;
   depositing a platinum layer on the glue layer;
   depositing an aluminum alloy mask layer having a high selectivity with the platinum layer on the platinum layer;
   patterning the aluminum alloy mask layer to be spaced apart by a predetermined distance;
   etching the platinum layer using the patterned aluminum alloy mask layer and a gas chosen from the group comprising $CF_x$, $C_yF_x$, $C_2F_4$ or $C_2F_8$ and $O_2$ such that an etch ratio of the aluminum alloy mask layer and the platinum layer more than 2; and
   etching the glue layer with the patterned aluminum alloy mask layer and the platinum layer serving as masks.

8. The method as claimed in claim 7, wherein the etching the platinum layer step etches the platinum layer such that, an etch ratio between the platinum and aluminum alloy mask layer of 50:1 results.

9. The method as claimed in claim 7, wherein, in the etching the platinum layer step, etching is performed at a pressure in a range of 5~10 mTorr.

10. The method as claimed in claim 7, wherein in the etching the platinum layer step, 300~600 w is imposed on a high-frequency provider (MHz) and 0~100 w on a low-frequency provider (KHz).

11. The method as claimed in claim 7, further comprising the step of:
    depositing a non-conductive layer on the aluminum alloy mask layer.

12. The method as claimed in claim 11, wherein the non-conductive layer is a silicon oxide film, a silicon nitride layer, or a photoresist film.

13. The method as claimed in claim 7, wherein the glue layer is formed of a titanium layer and a titanium nitride layer.

* * * * *